Jan. 10, 1967 R. W. BOWERS 3,297,855

METHOD OF BONDING

Filed June 26, 1964

INVENTOR
RONALD W. BOWERS

BY Robert W. Ely
ATTORNEY

United States Patent Office 3,297,855

Patented Jan. 10, 1967

3,297,855

METHOD OF BONDING

Ronald W. Bowers, Poughkeepsie, N.Y., assignor to International Business Machines Corporation, New York, N.Y., a corporation of New York Filed June 26, 1964, Ser. No. 378,397
4 Claims. (Cl. 219—85)

Figures 1, 2:
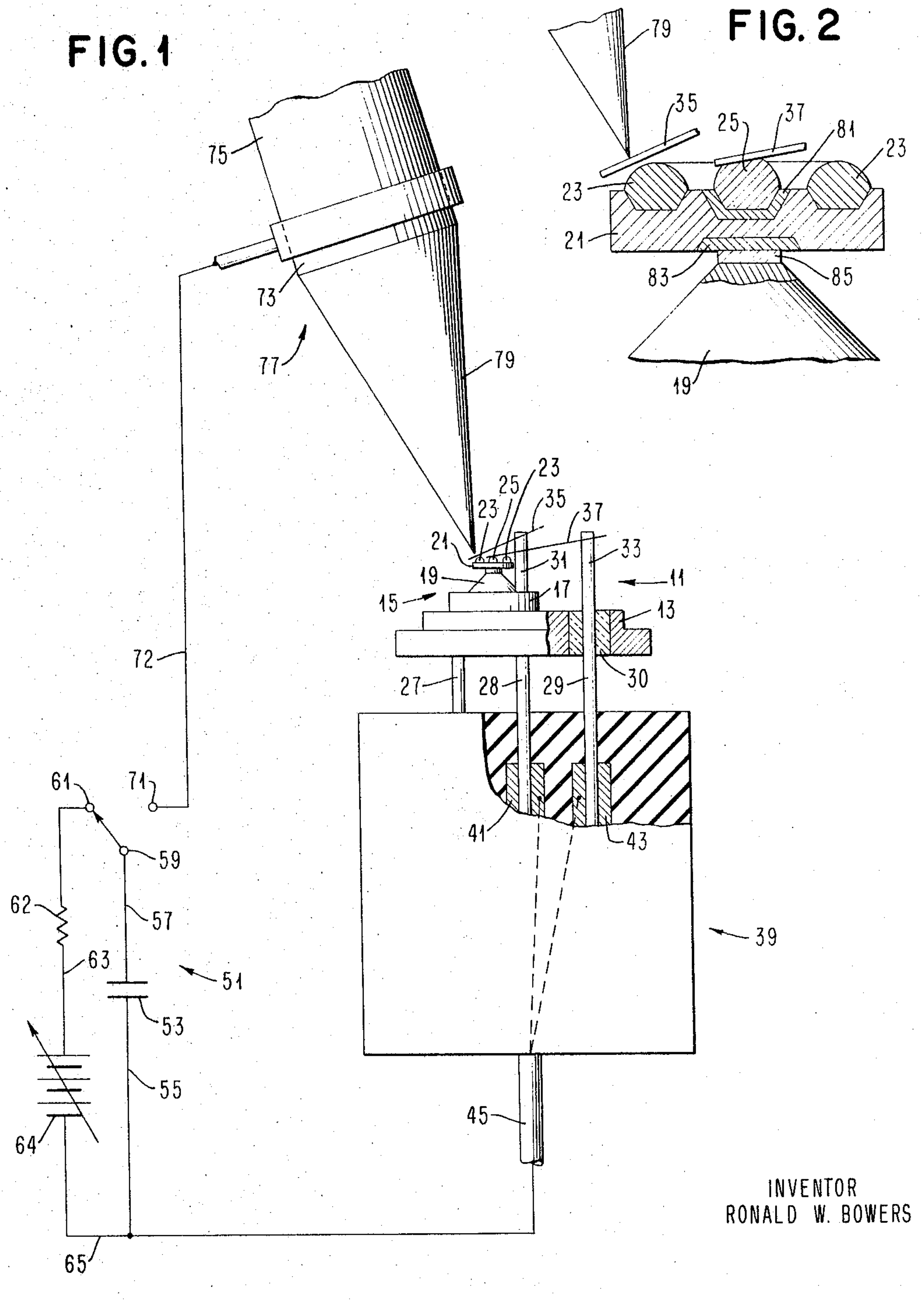

This invention relates to the manufacture of semiconductor devices and more particularly concerns the bonding of a small-diameter connecting wire to the small terminals of semiconductive elements.

Semiconductor devices, such as transistors and diodes, are conventionally fabricated with the desired electrical characteristics by alloying discs or rings of low-melting point, solder-like metallic material to semiconductive wafers. The residual dots or rings of metallic material form junction connections or terminals which require connection to external leads for the semiconductor device.

In a prior method of transistor manufacture, the whisker wires which were welded to the post-like leads were bent to make a resilient engagement with the base ring and the adjacent dot. Next the transistors were immersed for a brief period of time in a stearic acid or sodium hydroxide bath (held at 180° C.) to fuse the whiskers to the ring and the dot.

An object of this invention is to provide a more rapid method of bonding the whisker wires to the semiconductor terminals wherein a single operation gives positioning and bonding whereby bath immersion heating is avoided.

Another object is the provision of a method of bonding a whisker wire to a terminal by providing higher temperature, brief, localized heating whereby melting of adjacent parts is avoided so that stronger high temperature alloys can be used.

A object of the invention is to provide a method for bonding a whisker-like wire to an alloy dot or ring of small dimension without causing impurity diffusion which alters electrical characteristics.

A further object is the provision of electric bonding apparatus and method for bonding a small diameter connecting wire to a small terminal wherein positioning and brief resistance heating are effected without current passing through the semiconductor device.

In accordance with a particular form of the invention, a semiconductor device having an alloyed projection and a lead post is provided. A small diameter connecting wire is bonded to the lead post. A pointed graphite pencil is provided and is used to position the connecting wire into contact with the alloyed terminal. A particular capacitive discharge is passed through the pencil and the connecting wire to melt the alloyed projection whereby a bond to the wire is formed without harm to the device. The apparatus involved includes a capacitor, charging means, a two-way switch normally providing charging, and means connecting the transistor lead to the capacitor.

The realization of the above objects along with the features and advantages of the invention will be apparent from the following description and the accompanying drawing in which:

FIGURE 1 is a schematic view of a transistor in circuit with bonding means which includes a transistor socket, a capacitive discharge means, and a pointed graphite pencil in contact with a transistor connecting wire, and FIGURE 2 is an enlarged view of the transistor wafer section of FIGURE 1 and shows the point of the graphite pencil in position to urge a connecting wire against an alloyed projection.

Referring to FIGURE 1 of the drawing, the transistor 11 includes a metallic, disc-like header 13 and a collector connection structure 15 which has a circular base portion 17 and a conical boss 19. The bottom of the base portion 17 is suitably bonded to the top of the header 13. A disc-like wafer or element 21 made of germanium is bonded to the top of the collector connection structure 15. A ring-like formation 23 projects upwardly from the top peripheral surface of the semiconductor wafer 21. This formation 23 results from alloying a solder ring with the semiconductor wafer or element 21 so that a terminal to the base region of the semiconductor device is provided. A dot-like formation 25 projects upwardly from the center of the wafer 21. This dot-like formation results from alloying an impurity-yielding solder bead with the wafer 21 so that an emitter region in the wafer 21 is formed, as well as a connection terminal. The alloying is done at 650° C.

The transistor 11 has three external leads 27, 28 and 29 which extend downwardly from header 13. The upper part of lead 27 is suitably attached to header 13. The upper parts of leads 28 and 29 extend through glass bead insulators 30 (one shown) of header 13 to provide posts 31 and 33 which terminate appreciably above the level of the wafer 21. Whisker-like connecting wires 35 and 37 are bonded respectively to posts 31 and 33 in such a manner as to overlay the ring-like base terminal 23 and emitter terminal 25. The bottom parts of leads 27, 28 and 29 are received in a socket 39. The hand-held socket 39 pro-provides structure for supporting the transistor 11 and has contacts 41 and 43 connected to the socket wire 45 as indicated by the dashed lines to provide means to electrically connect transistor leads 28 and 29 to capacitive discharge means 51 shown at the left.

The capacitive discharge means 51 includes a capacitor 53 (8000 mfd.) which has its bottom lead 55 connected to socket wire 45. The upper lead 57 of capacitor 53 connects to a foot switch 59 which normally contacts its left terminal 61 to provide a charging circuit. The left terminal 61 of foot switch 59 connects through a current limiting resistor 62 (5 ohms) and wire 63 to the positive terminal of a variable direct current source 64 (set at 15 volts). A wire 65 connects the negative terminal of the direct current source 64 to the junction of capacitor lead 55 and socket wire 45.

The foot switch 59 has a right terminal 71 which connects by wire 72 to the band connector 73 mounted on the cylindrical part 75 of the pointed carbon rod or graphite pencil 77. The hand-held, light weight pencil 77 includes a finely sharpened, rectangular pointed tip 79 (flat bottom 20 by 5 mils) which extends downwardly to contact and position the end part of whisker 35 overlaying the ring-like, low-melting-point base connection 23. Thus, the tip is aligned with the projection.

Referring to FIGURE 2 which schematically shows the wafer section of the transistor 11 of FIGURE 1, it can be seen that the whisker 37 is bonded to the surface part or top portion of the alloy dot 25 which has a projecting half circle cross section as has ring 23. The pencil tip 79 is adapted to position the free end of the whisker 35 into contact with alloy ring 23 by being aligned with the ring 23. The starting wafer 21 constitutes an N-type base region having an alloyed ohmic connection to alloy ring 23. The alloy dot 25 is shown contiguous to a P-type emitter region 81. The boss 19 of connection 15 is bonded to a P-type collector region 83 through alloyed contact or solder disc 85 which is an alloying material composed of gold and lead. Both small diameter connecting wires or whiskers 37 and 35 are gold-plated, copper wires having a diameter of about .005 inch. The gold plating is 0.3 mil in thickness. The dot 25 is radially spaced from the ring 23 at each side by about .01–.02 inch. The vertical height of the ring 23 and dot 25 above wafer 21 is about .005–.01 inch. The composition of the rounded ring 23 and dot 25 is essentially lead with traces of impurities, such as antimony and indium, and thus constitutes a low-melting-point or solder-like material. It is aparent that small dimensions are involved and that prolonged bonding at high temperature and the resultant heating would harm adjacent parts of the device including melting of alloyed contact 83 which melts at 215° C. It is to be understood that other types of semiconductor devices, such as silicon or silicon-germanium alloys, having suitable alloyed terminals may be treated in lieu of a germanium device. Further, the semiconductor device may have two or four zones of opposite conductivity types with solder-like terminals. A silver-plated or solid gold wire can be used as a whisker wire.

In practicing the invention, a transistor 11 having the parts above described is provided and is mounted as shown in FIGURE 1 by inserting its leads 27, 28 and 29 in the socket 39, which electrically connects the leads to wire 45. Before mounting, the whiskers 35 and 37 are respectively bonded to lead posts 31 and 33 to overlay respectively the ring-like alloyed projection 23 and the dot-like alloyed projection 25. The capacitor 53 will have been fully charged, since the switch 59 is to the left in charging position. With the provided carbon rod 75, the operator will use the pointed tip 79 which is aligned toward the projections to position and hold or maintain successively the free ends of the whiskers against or into contact with the terminals or alloyed projections 25 and 23 during and briefly thereafter the passing of current. With the tip so positioning the whisker or small connecting wire 35, the operator will next move switch 59 to the right. This action causes the passing of a capacitive discharge from capacitor 53 through the tip 79, the end and the remainder of the whisker 35 and the lead post 31 to external lead 28 which extends through an insulating bead. The force on the pencil 77 during discharge determines the resistance and is such as to avoid splatter or too much melting. The light weight pencil also allows the operator to preferably push through the molten surface portion. The same operation is performed in relation to the other whisker 37. In both cases the capacitor discharge or direct current pulse is of such amplitude and duration to melt momentarily the upper part of the terminal without adverse effect on the junction region from the generated heat. The whisker is embedded in or bonded to the terminal upon resolidification by a strong bond due to localized heating from the current which is shunted through the whiskers to the lead posts.

It is apparent that the capacitive discharge pulse controls the bonding current amplitude, time and pulse shape. A very short bonding pulse of high amplitude (a 30-ampere peak with a 4-millisecond time constant) has been successfully used. Bonds have been achieved which more than double previous bond strengths and eliminated impact shock failure. The bonding current produces only localized heating at the contact point between the connecting wire and the pencil tip and thus the temperature can exceed a harmful equilibrium bonding temperature. The tip adds to the contact resistance to increase the total $I^2R$ heating. Since the brief, localized heating gives non-harmful, higher temperature, strong alloys can be made. For example, a gold plated whisker can be used in place of one coated with indium, as was used in furnace equilibrium bonding, without melting other parts of the device or adversely affecting the electrical characteristics. It is to be noted that, with this non-equilibrium bonding, the solder region 85 was a eutectic of gold and lead and was not affected, though it melts at 215° C. and the bonding temperature was appreciably above.

It is to be noted that the bonding current does not pass through the device and so does affect the electrical characteristics of the device. The graphite or carbon pencil resists corrosion at high temperatures, is easily sharpened, and does not alloy with the wire material. Productivity is high using the present invention since a single probe gives both positioning and bonding with very short bonding times required.

While the invention has been particularly shown and described with reference to a preferred embodiment thereof, it will be understood by those skilled in the art that various changes in form and details may be made therein without departing from the spirit and scope of the invention.

What is claimed is:

1. In the fabrication of a semiconductor device which has a semiconductor element with a solder-like terminal and has a lead post, the method comprising:
   bonding a small diameter connecting wire to the lead post so that the free end of the wire overlays the solder-like terminal of the semiconductor element;
   providing a carbon rod having a small pointed tip;
   positioning the free end of the connecting wire into contact with the solder-like terminal by urging the free end of the connecting wire with said pointed tip of said carbon which is aligned into said solder-like terminal, and
   passing a capacitive discharge only through the pointed tip of the carbon rod, the connecting wire and the lead post to melt momentarily the solder-like terminal locally at the contact with the connecting wire
   so that, upon solidification, the conecting wire is bonded into the terminal and so that the structure of the semiconductor device remains unchanged.

2. In the fabrication of a semiconductor device which has a semiconductor element with a solder-like terminal and has a lead post, the method comprising:
   bonding a small diameter connecting wire to the lead post so that the free end of the wire overlays the solder-like terminal of the semiconductor element;
   positioning the free end of the conecting wire into contact with the solder-like terminal by means of a pointed tip of a carbon rod;
   passing a capacitive discharge through the pointed tip of the carbon rod, the connecting wire and the lead post to melt momentarily the solder-like terminal locally at the contact with the connecting wire so that, upon solidification, the connecting wire is bonded to the terminal and so that the structure of the semiconductor device remains unchanged, the semiconductor device having its element mounted by an alloyed contact on a header and having a lead wire extending through an insulating bead to provide the post and an external lead; and
   the steps of passing the capacitive discharge including passing the discharge from the lead post to the external lead.

3. In the fabrication of semiconductor devices, the method comprising:
   providing a semiconductor device having a semiconductor wafer, an alloyed projection extending from the top of the wafer, a header on which the wafer is mounted at one side, and a lead wire extending higher than the wafer to form a lead post and through a glass bead in the other side of the header to below the header to form an external lead;
   bonding a whisker wire to the lead post so that the free end of the wire overlays the alloyed projection on the wafer;
   positioning the free end of the whisker wire into contact with the alloyed projection by using the pointed tip of a carbon rod so that the pointed tip is aligned with the alloyed projection; and
   passing a capacitive discharge through the pointed tip of the carbon rod, the whisker wire, the lead post and external lead to melt momentarily the alloyed projection at the contact with the whisker wire so that the whisker wire is slightly embedded in the alloyed projection upon its solidification.

4. In the fabrication of semiconductor devices the method comprising:

providing a semiconductor device having a semiconductor wafer, a small rounded alloyed projection extending from the top of the wafer, a header on which the wafer is mounted at one side, and a lead wire extending higher than the wafer to form a lead post and through a glass bead in the other side of the header to below the header to form an external lead;

bonding a whisker wire to the lead post so that it overlays the alloyed projection on the wafer;

positioning the whisker wire into contact with the alloyed projection by using the small rectangular tip of a carbon rod so that the pointed tip is aligned with the alloyed projection;

passing a capacitive discharge through the pointed tip of the carbon rod, the whisker wire, the lead post and external lead to melt momentarily the alloyed projection at the contact with the whisker wire so that the whisker wire is slightly embedded in the alloyed projection upon its solidification; and said alloyed projection being essentially lead and said whisker wire being flash plated with gold.

References Cited by the Examiner

UNITED STATES PATENTS

| | | | |
|---|---|---|---|
| 2,537,990 | 1/1951 | Graham | 219—113 |
| 2,784,300 | 3/1957 | Zuk | 219—117 |
| 3,197,608 | 7/1965 | Ingraham | 219—85 |

OTHER REFERENCES

Telefunken, G.m.b.H., German application 1,001,361, printed January 24, 1957.

References Cited by the Applicant

UNITED STATES PATENTS 2,916,604 12/1959 Doelp.

RICHARD M. WOOD, *Primary Examiner.*

B. A. STEIN, *Assistant Examiner.*